US010157728B2

(12) United States Patent
Tiphine et al.

(10) Patent No.: US 10,157,728 B2
(45) Date of Patent: Dec. 18, 2018

(54) LITHOGRAPHY METHOD WITH COMBINED OPTIMIZATION OF THE RADIATED ENERGY AND OF THE GEOMETRY APPLICABLE TO COMPLEX SHAPES

(71) Applicant: ASELTA NANOGRAPHICS, Grenoble (FR)

(72) Inventors: Charles Tiphine, Echirolles (FR); Sébastien Bayle, Fontaine (FR)

(73) Assignee: ASELTA NANOGRAPHICS, Grenoble (FR)

( * ) Notice: Subject to any disclaimer, the term of this patent is extended or adjusted under 35 U.S.C. 154(b) by 0 days.

(21) Appl. No.: 14/783,756

(22) PCT Filed: Apr. 17, 2014

(86) PCT No.: PCT/FR2014/000086
§ 371 (c)(1),
(2) Date: Oct. 9, 2015

(87) PCT Pub. No.: WO2014/177776
PCT Pub. Date: Nov. 6, 2014

(65) Prior Publication Data
US 2016/0079033 A1  Mar. 17, 2016

(30) Foreign Application Priority Data
Apr. 29, 2013  (FR) ..................................... 13 00997

(51) Int. Cl.
*H01J 37/302* (2006.01)
*H01J 37/317* (2006.01)
(Continued)

(52) U.S. Cl.
CPC .......... *H01J 37/3026* (2013.01); *B82Y 10/00* (2013.01); *B82Y 40/00* (2013.01); *H01J 37/3053* (2013.01);
(Continued)

(58) Field of Classification Search
CPC ............... H01J 37/3026; H01J 37/3174; H01J 2237/31764; H01J 2237/31769;
(Continued)

(56) References Cited

U.S. PATENT DOCUMENTS 5,863,682 A * 1/1999 Abe ........................ B82Y 10/00
250/492.2
6,107,207 A * 8/2000 Waas ........................ G03F 7/704
216/60
(Continued)

FOREIGN PATENT DOCUMENTS

FR  2959026 A1  10/2011

OTHER PUBLICATIONS www.merriam-webster.com/dictionary/insolation.*
(Continued)

*Primary Examiner* — Wyatt Stoffa
(74) *Attorney, Agent, or Firm* — Oliff PLC

(57) ABSTRACT

A method of generating data relative to the writing of a pattern by electronic radiation initially includes the provision of a pattern to be formed which form the work pattern with a single external envelope. The work pattern is broken down into a set of elementary outlines, each including a single external envelope. A set of insolation conditions is defined to model each elementary outline. An irradiated simulation pattern is calculated from the sets of insolation conditions associated with the sets of elementary outlines. The simulation pattern is compared with the pattern to be formed. If the simulation pattern is not representative of the
(Continued)

pattern to be formed, shift vectors are calculated. The shift vectors are representative of different intervals existing between the two patterns. The external envelope of the pattern to be formed is modified from displacement vectors determined from the shift vectors. A new iteration is carried out.

12 Claims, 2 Drawing Sheets

(51) Int. Cl.
    *B82Y 10/00*           (2011.01)
    *B82Y 40/00*           (2011.01)
    *H01J 37/305*          (2006.01)

(52) U.S. Cl.
    CPC . *H01J 37/3174* (2013.01); *H01J 2237/31764* (2013.01); *H01J 2237/31769* (2013.01)

(58) Field of Classification Search
    CPC ........ H01J 2237/31776; G06F 17/5081; G03F 7/70433
    See application file for complete search history.

(56) References Cited

U.S. PATENT DOCUMENTS

| | | | | |
|---|---|---|---|---|
| 6,275,604 B1* | 8/2001 | Miyajima | ............... | B82Y 10/00 382/144 |
| 7,669,174 B2* | 2/2010 | Emi | ....................... | B82Y 10/00 250/492.3 |
| 8,468,473 B1* | 6/2013 | Wang | .................. | H01J 37/3026 716/50 |
| 9,123,846 B2 | 9/2015 | Le Perchec et al. | | |
| 9,607,808 B2* | 3/2017 | Manakli | ................. | B82Y 10/00 |
| 2002/0177056 A1* | 11/2002 | Ogino | ................ | H01J 37/3026 430/30 |
| 2003/0152850 A1* | 8/2003 | Kamijo | ..................... | G03F 1/20 430/30 |
| 2005/0287451 A1* | 12/2005 | Hudek | ................... | B82Y 10/00 430/30 |
| 2012/0126145 A1* | 5/2012 | Yashima | ............... | B82Y 10/00 250/492.3 |
| 2013/0099139 A1* | 4/2013 | Kato | .................. | H01J 37/3174 250/492.3 |
| 2013/0181379 A1* | 7/2013 | Manakli | ................. | B82Y 10/00 264/485 |

OTHER PUBLICATIONS

Pavkovich, J.M., "Proximity effect correction calculations by the integral equation approximate solution method," Journal of Vacuum Science Technology, vol. B4, No. 1, (1986), pp. 159-163.

Jul. 29, 2014 Search Report issued in International Patent Application No. PCT/FR2014/000086.

\* cited by examiner

LITHOGRAPHY METHOD WITH COMBINED OPTIMIZATION OF THE RADIATED ENERGY AND OF THE GEOMETRY APPLICABLE TO COMPLEX SHAPES

BACKGROUND OF THE INVENTION

The invention relates to a method of generating data relative to the manufacturing of a pattern by insolation from an electronic radiation and to a method of manufacturing a pattern by insolation from an electronic radiation.

STATE OF THE ART

In the field of integrated circuits, electron gun writing systems are currently used to define patterns having small dimensions.

In such writing systems, electrically-charged particles are projected onto the surface of a layer, commonly called resin. The electronic radiation causes the reaction of a portion of the resin layer to define two materials having different physico-chemical properties. Such property differences are used in a subsequent development step, which enables to form one or a plurality of patterns.

The applied insolation conditions enable to define the shapes and the positions of the different patterns. However, to transform the material forming the reactive layer into another material having different physico-chemical properties, a sufficient quantity of electrons should transmit their energy into the layer. Now, in practice, there exist unavoidable electron scattering phenomena (diffraction of the incident beam, different scattering mechanisms within the resin and the adjacent materials, part of the electrons come out of the resin, and part of the electrons which have come out return into the resin after a reflection on an external element or after back scattering from the substrate). Because of such scattering phenomena, the energy sent into the resin is not simply dependent on the shape of the incident electron beam. A judicious choice thus has to be made in the insolation and development conditions so that the patterns formed are as in accordance as possible with what is expected.

In embodiments called raster scanning and vector scan, the electron beam displaces with respect to the reactive layer to define one or a plurality of patterns which will form the final pattern. In another embodiment called variable shaped beam, the beam is projected through one or a plurality of openings which are arranged to define the desired pattern. Conventionally, the different portions of each pattern are obtained from the use of a plurality of electron gun shots.

The shape of the pattern to be formed is broken down into a plurality of elementary outlines. The different elementary outlines are then analyzed to define the conditions of insolation by the electron beam. Thereby, the initial pattern is broken down into a plurality of electron gun shots which are representative of the associated elementary outline.

Since it is not easy to totally modify the shape of the electron beam, or to control the electron scattering within the reactive layer, it is not possible to directly form all the shapes present in the pattern. In practice, equipment generating the electronic radiation has a small set of possible shots and also has a limited size.

Proximity effects, particularly between neighboring patterns, generally translate as a significant shape difference between the obtained pattern and the initially desired pattern. To increase the faithfulness between the final pattern and what is requested, different strategies are being developed.

In document U.S. Pat. No. 6,107,207, the dose applied to the pattern edges is increased, which translates as a significant increase in the exposure time. In the case, the shape defined by the elementary outlines is identical to the shape of the pattern to be formed.

Document FR 2 959 026 provides a method of combined optimization of the energy of the applied electronic radiation and of the application area. A pattern to be formed is broken down into unit elements and shot modulations are calculated for each unit element. The shapes of the unit elements are modified by adding a lateral strip so that the radiated dose enables to define a final pattern which is faithful to the shape of the desired pattern.

SUMMARY OF THE INVENTION

There appears to be a need to provide a method of generating data relative to the forming of a pattern, which decreases the shape difference between the desired pattern and the pattern obtained after insolation by the electron beam.

This need tends to be fulfilled by means of a method which comprises:
S1) Providing a pattern to be formed on a substrate,
S2) Forming a work pattern from the pattern to be formed, the work pattern comprising a single external envelope,
S3) Breaking down the work pattern into a set of elementary outlines comprising a plurality of elementary outlines, each having a single external envelope, and defining a set of insolation conditions for each elementary outline,
S4) Comparing the pattern to be formed with a simulation pattern representing the sets of insolation conditions for the elementary outlines to discriminate a simulation pattern representative of the pattern to be formed from a simulation pattern which is not representative of the pattern to be formed,
wherein, if the simulation pattern is not representative of the pattern to be formed, the method comprises:
S7) Determining at least one shift vector between at least a portion of the external envelope of the pattern to be formed and a corresponding portion of the external envelope of the simulation pattern,
S8) Displacing at least a portion of the external envelope of the work pattern or of the pattern to be formed according to a displacement vector determined at least from the corresponding shift vector to form a new work pattern,
Carrying out a new iteration of steps S3) and S4).

BRIEF DESCRIPTION OF THE DRAWINGS

The foregoing and other features and advantages of the present invention will more clearly appear from the following non-limiting description of specific embodiments of the invention, shown in the accompanying drawings, among which.

DESCRIPTION OF SPECIFIC EMBODIMENTS OF THE INVENTION

Figure 1:
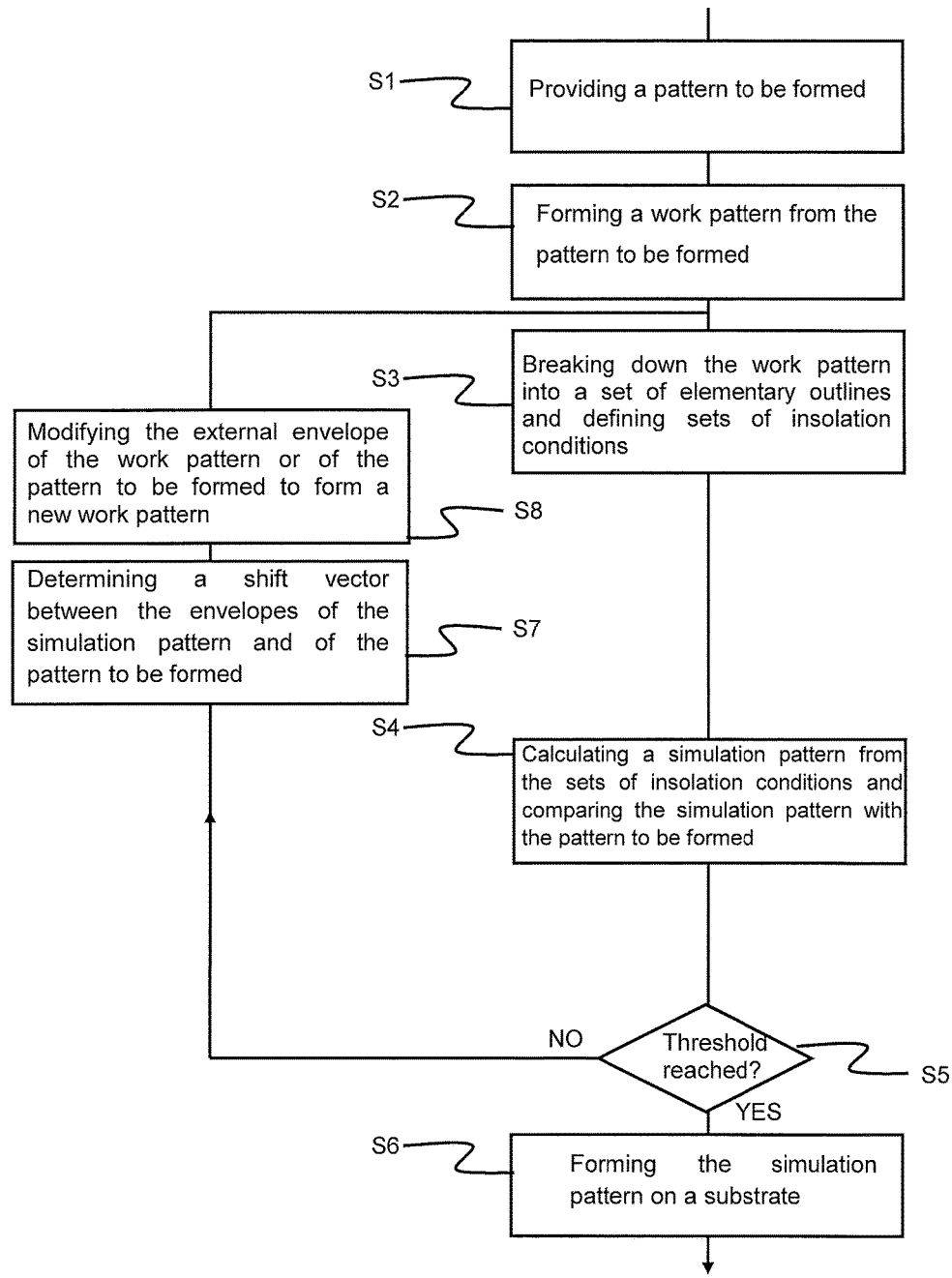
FIG. 1 shows a flowchart of the different steps of the method of forming a desired pattern, FIGS. 2 to 6 schematically show the pattern to be formed, the work pattern, the elementary outlines, and the simulated patterns during the different steps of the method.
Figure 2:
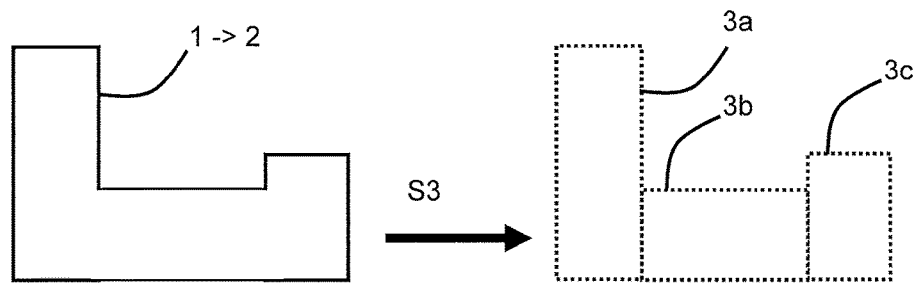

As illustrated in FIGS. 1 and 2, a pattern to be formed 1 is provided to be formed on a substrate. At a step S1, a first pattern 1 is provided and it corresponds to the pattern desired by the user, that is, pattern to be formed 1. Pattern to be formed 1 is defined by a shape, that is, a configuration in the associated plane, and an area (a surface area). These two characteristics are simultaneously represented by the external contour of the pattern, that is, the external envelope which defines pattern 1. These components enable to characterize and to differentiate patterns from one another. Pattern to be formed 1 may have any shape, such as a square, a rectangle, a circle, or a free shape. The pattern to be formed may have one or a plurality of holes.

Pattern to be formed 1 is defined by an external envelope which is continuous and closed. Pattern to be formed 1 thus is a single pattern. It is not defined by a set of elementary patterns distinct from one another. Pattern to be formed 1 may be representative, for example, of a gate electrode, of an active area within which source and drain electrodes will be defined, an electric contact or any other integrated circuit element. It is also possible to use the method for other applications.

The substrate is of any type, it may be electrically conductive or insulating. The substrate may be a semiconductor substrate or a transparent substrate which will subsequently be used as a photolithography mask. The substrate comprises a reactive layer which is configured to react with the electronic radiation, for example, a resin.

In a second step S2, pattern to be formed 1 is used to form a work pattern 2. Advantageously, work pattern 2 exactly corresponds to pattern to be formed 1. It can however be envisaged to slightly modify pattern to be formed 1 to form work pattern 2. For example, certain shapes are eliminated since they have a dimension smaller than the technical capacities of resin and/or of the electron beam. Such a simplification of work pattern 2 (with respect to pattern to be formed 1) enables to decrease calculation times.

At a step S3, work pattern 2 is broken down into a set of elementary outlines 3. As an example, work pattern 2 is broken down into three elementary outlines 3a, 3b, and 3c.

During breaking down S3 illustrated in FIG. 2, work pattern 2 is broken down into a plurality of elementary outlines 3 which advantageously have standardized shapes. Advantageously, the elementary patterns are memory-saving patterns and/or patterns which enable to decrease the duration of the breakdown step. Preferably, elementary outlines 3 have simple shapes. In a specific embodiment, the elementary outlines are convex polyhedrons having at most four sides. For example, elementary outlines 3 are squares or rectangles. The shape of elementary outlines 3 may be imposed by the technical capacities of the equipment generating the electronic radiation. However, in an alternative embodiment, elementary outlines 3 may have a curvilinear contour. Advantageously, the shapes of the different elementary outlines are defined by the electronic lithography equipment which has a limited number of insolation conditions defining accessible outlines. Each elementary outline is assigned a dose which may comprise one or a plurality of shots.

Elementary outlines 3 advantageously have a simpler shape to ease, afterwards, the transposing of their shape into characteristics relative to one or a plurality of exposures of an electronic radiation. Each elementary outline 3 is defined by its shape (which comprises the value of its surface area), that is, by its external envelope. Each elementary outline 3 is also defined by its position. In the example illustrated in FIG. 2, pattern to be formed 1 is broken down into three elementary outlines which are shown as rectangles having different dimensions and different positions.

Elementary outlines 3 are advantageously arranged adjacent to one another to avoid the presence of empty areas, that is, non-irradiated areas, which very strongly modifies the final shape of the pattern. Elementary outlines 3 are advantageously arranged adjacent to one another to avoid the overlapping of two adjacent elementary outlines 3.

The association of the different elementary outlines 3 forms work pattern 2, which is pattern to be formed 1 or a pattern very close to pattern to be formed 1. During breaking down S3, elementary patterns 3 are configured to copy as faithfully as possible the shape of the external envelope of work pattern 2. The external envelope of the different elementary outlines 3 will define the shape of the final pattern which will be formed by the electronic radiation. It has been discovered that an important parameter for a good definition of electronic lithography patterns is the pattern surface area. However, the work performed on the pattern shape is completed by the work performed on the pattern dose. By giving a greater weight to the shape of the pattern to be achieved as compared with prior art, it is possible to form a pattern which is more in accordance with the desired pattern.

The user or the equipment applying the electronic radiation may impose constraints, such as the maximum number of elementary outlines 3 generated during the breaking down. It is also possible to determine the minimum and/or maximum surface area occupied by an elementary outline, or also the maximum number of electron shots to define an elementary outline. All these constraints complicate the forming of an irradiated pattern close to pattern to be formed 1. For example, it is possible to impose for the maximum dimension of an elementary pattern to be smaller than 1 µm.

Each elementary outline 3 is represented, for example, by one or a plurality of electron shots with doses and positions which may vary between shots. In other words, elementary outlines 3 are modeled by electronic insolation conditions gathered in the form of sets of insolation conditions. In other words, to form an elementary outline, and thus a pattern, a plurality of shots are carried out. These different shots are representative of the dose necessary to define the elementary outline.

The user may use different techniques, with beam overlaps, variable beam widths, different acceleration voltages, or other techniques known to have a set of insolation conditions which is as close as possible to the elementary outline. In practice, electronic irradiation equipment does not enable to vary the acceleration voltage and the exposure time at the same time. The equipment is advantageously configured to provide different doses measured in $\mu C/cm^2$.

In a specific embodiment, geometric breaking down S3 of work pattern 2 is decoupled from the strategy of electronic radiation distribution within elementary outlines 3. As indicated hereabove, pattern to be formed 1 is transformed into a work pattern 2 and work pattern 2 is broken down into a plurality of elementary patterns 3. In parallel, the work space which comprises pattern to be formed 1 and advantageously a group of patterns to be formed is divided into a plurality of reference areas. A density value is associated with each reference area. The density value shows, for example, the ratio of the surface area occupied by the pattern(s) to the surface area of the reference area. Once the different density values have been calculated, it is possible to calculate the dose to be applied to each reference area to reproduce as faithfully as possible the outline included in the reference area. Advantageously, the previously-calculated density is convoluted with the long-range density of the electron scattering model (also called point spread function).

The strategy of association of the electronic radiation doses with each reference area may be achieved by different techniques, for example, with a long-range strategy or by means of a strategy described in document "Proximity effect correction calculations by the integral equation approximate solution method", J. M. Pavkovich J. Vac. Sci. Technol. B 4(1) January/February 1986. Thereby, it is possible to simply form a first set of insolation conditions which is representative of pattern to be formed 1.

Then, it is advantageous to put in relation elementary outlines 3 defined in the geometric analysis of pattern to be formed 1 and the first set of insolation conditions associated with the reference areas to form the set of insolation conditions associated with each elementary outline 3.

In a particularly advantageous embodiment, the area of each elementary outline 3 is smaller than the area of a reference area to limit corrections on electronic irradiation doses. This particularity eases the convergence of the method.

Particularly advantageously, the dose difference between two adjacent elementary outlines and/or between two adjacent reference areas is smaller than 30% to ease the convergence of the method.

The conditions of the modeling of an elementary outline 3 as a set of insolation conditions are selected so that the shape of the elementary outline is kept as much as possible. However, as indicated hereabove, the electrons configured to represent the elementary outline partly scatter outside of the envelope.

A step of simulation S4 of a simulation pattern 4 is carried out. During this simulation step, the different sets of insolation conditions associated with the different elementary outlines 3 are used to determine the shape of simulation pattern 4, that is, the pattern which should be obtained after electronic irradiation. The determination of the simulation pattern takes into account the insolation conditions applied to form the different elementary patterns 3. The determination of the simulation pattern also takes into account the scattering of part of the electronic radiation outside of the elementary pattern, which will modify the behavior of the resin for the adjacent elementary outlines.

Figure 3:
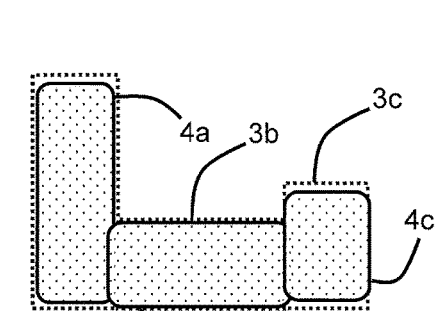

As can be seen in FIG. 3, there are differences between the initial model (the work pattern) and what is obtained after simulation and which takes into account implementation artifacts, for example, a rounding of corners. Patterns 4a, 4b, and 4c show patterns of simulation respectively of patterns 3a, 3b, and 3c in the case of a simulation without taking into account scattering phenomena between the different elementary outlines.

Simulation pattern 4 takes into account the physical effects of the interaction of electronic radiation with matter, particularly the long-range reflection of back-scattered electrons (fogging). The definition of the simulation pattern may also take into account other degradation phenomena due to electronic irradiation and/or to subsequent steps of the method. For example, the simulation may take into account etching artifacts if the pattern to be formed is used as an etch mask so that the etched pattern is more faithful to what is desired. For example, the simulation enables to take into account a double irradiation which particularly occurs because of the scattering.

Figure 4:
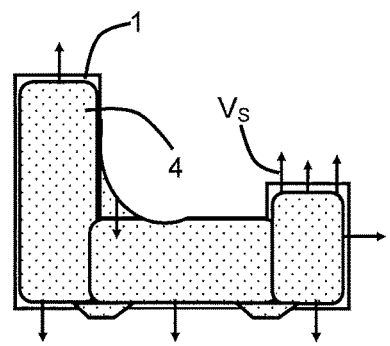

As an example, for a pattern having dimensions in the order of 10 nm, there is an electron scattering in the order of 10 µm. Simulation pattern 4 is partly dependent on the insolation conditions associated with the elementary outline. Simulation pattern 4 also takes into account the insolation conditions of adjacent elementary outlines to take into account electron scattering as illustrated in FIG. 4.

At step S4, simulation pattern 4 is compared with pattern to be formed 1 which is desired by the user. Comparison step S4 enables to discriminate a simulation pattern 4 representative of pattern to be formed 1 from a simulation pattern which is not representative of pattern to be formed 1. If simulation pattern 4 is representative, the same is true for associated work pattern 2 and the set of elementary outlines 3.

Advantageously, during this comparison, the shape of simulation pattern 4 is particularly compared with the shape of pattern to be formed 1 in order to know, for example, whether simulation pattern 4 is within the outline of pattern to be formed 1 or if, conversely, simulation pattern 4 goes over the edges of pattern to be formed 1.

During comparison S4, one or a plurality of criteria are calculated and are compared with a threshold at a step S5.

The difference between the shape of irradiated pattern 4 and the shape of pattern to be formed 1 is calculated. Different techniques may be used to calculate the criterion or criteria, which will then be compared with a threshold. The comparison criterion may take into account the difference in surface area between the two patterns, which provides first information as to the difference between patterns. The criterion may also take into account the maximum distance which exists between the two patterns.

To compare simulation pattern 4 and pattern to be formed 1, different techniques are possible. The areas representative of the differences are compared with a threshold. It is also possible to take one or a plurality of reference areas where the distance which separates pattern to be formed 1 and simulation pattern 4 is used to define the criterion which will be compared with the threshold. These different techniques may be combined.

The criterion representative of the difference is compared with a threshold. If the criterion is lower than the threshold (output YES of S5), simulation pattern 4, and thus elementary outlines 3, are representative of pattern to be formed 4. At a step S6, the sets of insolation conditions relative to the work pattern used may be sent to a processing device. The processing device may be a device for controlling the electron gun, which enables to form pattern 1 on a substrate. The processing device may also be a device for storing information, which will then be sent to an electron gun control device.

If the criterion is greater than the threshold (output NO of S5), simulation pattern 4 is not sufficiently representative of pattern to be formed 1 and thus, elementary outlines 3 are not considered as successfully completed. A new iteration is carried out with the definition of a new work pattern 2.

In the example illustrated in FIG. 4, there is an overlapping of a plurality of irradiated areas in conditions which result in a significant modification of the shape of simulation pattern 4 with respect to what is expected by means of elementary outlines 3 and of the set of insolation conditions taken isolatedly. In the case of FIG. 4, such double-irradiation effects translate as an extension of irradiated pattern 4 beyond the shape of initial pattern 1. There also is a significant shift at the edges for patterns 3a and 3c or the filling of a concave corner.

Simulation pattern 4 may have one or a plurality of regions which go over the edges of pattern to be formed 1. There may also be one or a plurality of regions where the shape of the simulation pattern is recessed with respect to pattern to be formed 1.

Since the two compared patterns are different, at least one shift vector $V_S$ is determined at a step S7. Shift vector $V_S$ corresponds to the shift between at least a portion of the external envelope of pattern to be formed 1 and a corresponding portion of the external envelope of simulation pattern 4. The external envelope of simulation pattern 4 is broken down into a plurality of reference areas which may be points of the contour, or larger portions of this contour.

For each reference area, a shift vector $V_S$ is determined, which represents the difference existing between the reference area of simulation pattern 4 and the corresponding reference area of pattern to be formed 1. The different shift vectors $V_S$ represent the direction and the amplitude of the differences between the two patterns. The different shift vectors $V_S$ translate the distribution of shifts between surfaces and possibly between different portions of a same surface, as illustrated in FIG. 4.

The reference area advantageously contains the middle of the surface on which it is located. Indeed, there often is a rounding of the polyhedron edges, and it is expensive in terms of calculation time to perform an optimization of the insolation conditions to obtain a perfectly-defined edge. Since the active portions of the outlines are mainly placed in the middle of the sides, it is advantageous to favor a good reproduction of the pattern to be formed as concerns the middle of its sides rather than its corners. In a specific embodiment, the method is configured to ensure that the dimensions are respected in one or a plurality of privileged areas. In this case, the method accepts differences in the other areas, for example, for right angles which are not respected.

Figure 5:
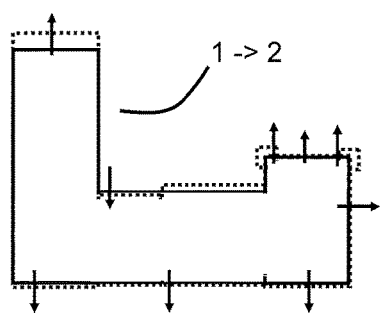

In a first embodiment illustrated in FIG. 5, a new work pattern 2 is formed from pattern to be formed 1 or work pattern 2 at a step S7. It is preferable to start again from pattern to be formed 1 instead of work pattern 2 of the previous iteration since characteristics having small dimensions may have disappeared during the modeling step. Using pattern to be formed 1 enables to more easily converge towards a relevant work pattern 2. In the following example, the reworked pattern is pattern to be formed 1.

The reference areas of pattern to be formed 1 are displaced by means of a displacement vector $V_D$ which is defined at least from the shift vector. Advantageously, shift vector $V_S$ and displacement vector $V_D$ are collinear. More advantageously still, shift vector $V_S$ and displacement vector $V_D$ have the same sense. Displacement vector $V_D$ is formed from shift vector $V_S$ so that the difference which has been measured between simulation pattern 4 and pattern to be formed 1 is decreased during the next iteration. In an advantageous embodiment, the displacement vector is determined from a plurality of shift vectors, preferably adjacent shift vectors.

If simulation pattern 4 is inside of pattern to be formed 1, the calculator determines that work pattern 2 should have one or a plurality of increased dimensions to become closer to pattern to be formed 1. The external envelope is displaced, which forms the new work pattern 2 which takes into account information relative to the shift which originate from shift vectors $V_S$.

In the example illustrated in FIG. 5, the different sides of pattern to be formed 1 are treated differently. Certain sides are cut into a plurality of pieces and are treated independently. A possible result thereof may be that an initially straight side is transformed into a crenellated side. Other sides have a plurality of reference areas but the treatment is configured so that the side remains planar. In other configurations, a single reference area may be arranged on the side to define the displacement of the entire side.

Thus, for each iteration, a new work pattern 2 is formed by advantageously starting from pattern to be formed 1 and by displacing at least a portion of the external envelope of pattern to be formed 1 according to the set of displacement vectors $V_D$. Work pattern 2 is the pattern which is submitted to the breakdown step, the shape of the work pattern may significantly differ from the shape of pattern to be formed 1 to take into account proximity effects which have been assessed in the previous iterations. Work pattern 2 is described by its contour, and its shape should advantageously anticipate the degradations performed, in particular, by proximity effects.

The specific displacement conditions of the external envelope of pattern to be formed 1 to form work pattern 2 may be achieved by any adapted algorithm. For example, the specific displacement conditions may implement a PID or Proportional-Integral-Derivative controller. It is also possible to use another correction type.

In a preferred embodiment, the transformation of pattern to be formed 1 is configured so that the parallelism between the sides of work pattern 2 and the sides of pattern to be formed 1 is kept.

For each iteration, work pattern 2 is generated according to the conditions detected in the previous iteration. Since work pattern 2 varies at each iteration, the breaking down conditions vary. For each iteration, the set of elementary outlines 3 is modified. In the example of FIG. 5, the initial set of three elementary outlines is transformed into a set of seven elementary outlines 3a-3g (FIG. 5).

In a specific embodiment, the breaking down into a set of elementary outlines 3 takes into account conditions existing on the set of elementary outlines 3 of the previous iteration. As an example, the method may be configured so that the variation of the number of elementary outlines is lower than 40% so that the variations to come on the insolation conditions are not too much modified. This condition eases the convergence of the method.

New breaking down S3 of work pattern 2 results in the definition of a new set of elementary outlines 3. This new set of elementary outlines 3 advantageously comprises unchanged elementary outlines 3, elementary outlines which are spatially displaced but unchanged in their shape, and elementary outlines which have changed shape. It is also possible to have an elementary outline 3 disappear from the previous set and/or a new elementary outline 3 be created.

In the specific example illustrated in FIG. 5, work pattern 2 has been modified by means of displacement vectors $V_D$ as compared with work pattern 2 of the previous iteration. Since the shape of the general envelope has changed, the conditions of the breakdown step have changed. The general shape of pattern 3a is generally unchanged. The initially rectangular pattern has been modified in one of its dimensions. However, pattern 3b has been broken down into two different patterns 3b and 3d to take into account the level difference performed to limit the extension of the rounding of the inner edge between patterns 3a and 3b of the previous iteration.

Similarly, pattern 3c has been broken down into four patterns 3c, 3e, 3f, and 3g. Patterns 3e and 3f enable to limit rounding effects on the outer corners of initial pattern 3c.

Since a new set of elementary outlines 3 is formed, there is an association of a new set of insolation conditions to model new work pattern 2.

Figure 6:
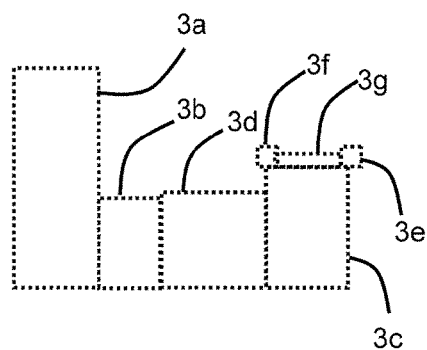
Figure 6:
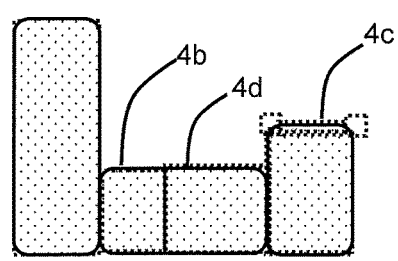

As previously, the set of insolation conditions is used to form a simulation pattern 4 as illustrated in FIG. 6. Simulation pattern 4 is then compared with the threshold to determine whether the elementary outlines are considered as successfully completed or not. The modification of work pattern 2 is performed on the shape of its external envelope to compensate for the differences observed in the previous iteration. In the illustrated example, the significant differences detected during the previous iteration have been nearly corrected. The excessive rounding of the concave corner has been eliminated by decreasing the height of elementary outline 3b with respect to the height of elementary outline 3d without for this to induce a notable variation in the thickness of the simulation pattern.

Thereby, between two successive iterations, at least a portion of elementary outlines 3 is modified by taking into account the information of the previous iteration and the modifications are successively performed on the external envelope of the work pattern to come closer to pattern to be formed 1, which enables to ease the convergence of the method.

Here again, at the end of the new iteration, if the difference with pattern to be formed 1 is lower than the threshold, simulation pattern 4 is considered as close to pattern to be formed 1 and the insolation conditions may be used to form final pattern 1 on the layer to be irradiated.

These steps of the method are repeated as long as the difference between simulation pattern 4 and pattern to be formed 1 is greater than the threshold.

Once the threshold has been reached, the information relative to work pattern 2, the information relative to elementary outlines 3 and/or the information relative to the irradiation conditions are sent to a processing device. The processing device is then used to form pattern to be formed 1 on a substrate.

The method may be implemented by any adapted calculator. It is possible to carry out the method from sets of instructions recorded in a memory configured to be read by a computer.

In a specific embodiment, the breaking down conditions applied during step S3 are different from the breaking down conditions applied by the equipment generating the electronic radiation.

In this case, the comparison between simulation pattern 4 and pattern to be formed 1 is lower than the threshold. Work pattern 2 and the resulting elementary outlines are representative of pattern to be formed 1. A new breaking down is however performed.

In this new breaking down, work pattern 2 is identical or substantially identical to that which has been validated. Work pattern 2 is broken down with new breaking down conditions, which may define a new set of elementary outlines. The breaking down conditions being different, it is possible for the result to be less relevant than what had been previously obtained. With this new breaking down, a new set of insolation conditions may be associated with the new set of elementary patterns. This information may be sent to the equipment generating the electronic radiation to form pattern to be formed 1, for example, by illuminating a resin.

This embodiment is particularly advantageous since the breaking down conditions applied by the electromagnetic radiation generation device are highly limiting in the selection of the elementary pattern shapes. In this case, more practical conditions are applied in the iteration loops, which enables to form a work pattern 2 within a minimum time. Then, once the work pattern has been formed, the latter may be slightly degraded by applying stricter breaking down conditions. The use of two different breaking down conditions is particularly advantageous when the differences are essentially due to geometrical pattern cutting constraints. In this case, the modifications performed on the work pattern during the iterative portion have little or no influence on the final result. The final shape of work pattern 2 is still representative of pattern to be formed 1. Only the final cutting of the work pattern changes, with a weak effect on the shape of the final pattern. This particularity enables to save calculation time.

Advantageously, the two breaking down conditions are configured so that the sizes of the elementary patterns are substantially equal, that is, the surface variations are lower than 50%. Also advantageously, the two breaking down conditions are configured so that the general shapes of the outlines are kept.

In another embodiment, the number of iterations may be limited to a maximum threshold. Thereby, if the method is not capable of providing the conditions enabling to obtain a relevant work pattern, the method is stopped when the maximum threshold is reached. The use of a maximum threshold enables to avoid for the method to run for long periods, for example, if the shape of the pattern to be formed does not enable the method to converge.

In a specific embodiment which may be combined with the previous embodiment, the algorithm for determining the electronic doses to be applied uses a model of electron scattering in matter which has a short-range component and a plurality of medium- and long-range components. It is advantageous to use some of these scattering model parameters to define characteristics of the elementary outlines or of the reference areas.

If the short-range component is modeled by a Gaussian distribution of the electrons with a standard deviation called A, it is advantageous to ascertain that the dimensions of pattern to be formed 1 are larger than the standard deviation. If a plurality of different patterns are to be formed, each pattern to be formed 1 should be analyzed.

More advantageously still, it is possible to define that the displacement vector is selected to have a standard greater than or equal to half the standard deviation of the Gaussian distribution for each iteration. Such a precaution enables to ease the convergence.

In a specific case, the scattering model provides that the medium- or long-range components are by a number N and are each represented by Gaussian curves called $B_X$, with X varying from 1 to N and representing the order of the component. The component of rank 1 is the component closest to the short-range component. It is advantageous to ascertain that the breaking down conditions are selected so that the dimensions of the elementary patterns are five times smaller than the standard deviation of the component of rank 1 (medium-range component of rank 1). Such a precaution also enables to ease the convergence.

Particularly advantageously, the number of elementary outlines 3 is not modified by more than 30% between two successive iterations to ease the convergence of the method.

Particularly advantageously, the surface area of each of elementary patterns 3 is not modified by more than 30% between two successive iterations to ease the convergence of the method.

It is particularly advantageous to limit the modification of the characteristics of intermediate outline 3 between two iterations since the different elementary outlines 3 are used to define the insolation conditions with one or a plurality of electronic radiations. Strongly modifying a plurality of parameters may cause a strong increase of the difference between pattern to be formed 1 and that provided by the method. Keeping the initial characteristics of elementary outlines 3 enables to decrease risks of divergence of the data generation method for the forming of patterns.

In a particularly advantageous embodiment, elementary outlines 3 do not overlap to avoid for certain areas to be irradiated a plurality of times. Such a precaution enables to decrease write artifacts due to at least a strong double irradiation of a same region of the resin.

In a specific embodiment, the dose assigned to an elementary pattern is calculated only once and this result may be used for a plurality of sets of successive elementary outlines, or even for all sets of elementary outlines. In an alternative embodiment, the dose assigned to each elementary pattern is calculated each time to take into account the variations made at each iteration.

As compared with prior art methods, the method enables to provide a correction solution for patterns having complex shapes. In the method, the breaking down is carried out later, which enables to ensure the coherence of the set of elementary outlines when it is desired, that is, no overlapping between patterns. Such a coherence provides a more faithful simulation pattern rendering and a better breaking down quality, for example, by limiting the number of elementary outlines.

As an example, as compared with a method according to document U.S. Pat. No. 6,107,207, the illustrated method enables to decrease the number of shots, which increases the insolation speed.

As compared with the method according to document FR 2959026, the illustrated method enables to take into account proximity effects introduced by the different modifications performed on the elementary outlines in the different iterations.

The method is particularly advantageous for the transformation of the complex patterns to be formed. Indeed, the breakdown steps are associated with a simulation step and a step of comparison with the pattern to be formed to define the differences. The iterative process enables to correct imperfections due to the corrective actions performed on the different elementary patterns by taking into account proximity effects which exist between all the radiated doses. As a comparison, in prior art, the breaking down is performed once and for all at the beginning of the method.

The invention claimed is:

1. A method of writing a pattern by electronic radiation, comprising the steps of:
   S1) providing a pattern to be formed on a substrate to a calculator;
   S2) forming a work pattern from the pattern to be formed, the work pattern comprising a single external envelope;
   S3) breaking down the work pattern into a set of elementary outlines comprising a plurality of elementary outlines each having a single external envelope, and defining a set of irradiation conditions for each elementary outline; and
   S4) comparing the pattern to be formed with a simulation pattern representing the sets of irradiation conditions for the elementary outlines to discriminate a simulation pattern representative of the pattern to be formed from a simulation pattern which is not representative of the pattern to be formed;
   wherein, if the simulation pattern is not representative of the pattern to be formed, the method comprises the steps of:
   S7) determining at least one shift vector between at least a portion of the external envelope of the pattern to be formed and a corresponding portion of the external envelope of the simulation pattern;
   S8) displacing at least a portion of the external envelope of the work pattern or of the pattern to be formed according to a displacement vector determined at least from the corresponding shift vector to form a new work pattern; and
   carrying out at least a new iteration of steps S3) and S4) before writing the pattern on the substrate using at least a final iteration of the work pattern,
   the method further comprising: S9) writing the pattern using at least the final iteration of the work pattern.

2. The method according to claim 1, wherein during the step S3), the first set of elementary outlines is configured to avoid an overlapping between two adjacent elementary outlines.

3. The method according to claim 1, wherein during the step S3), the positions of part of the elementary outlines are identical to the positions occupied by part of the elementary outlines of the previous iteration.

4. The method according to claim 1, wherein during the step S3), the shapes and the surfaces of part of the elementary outlines are identical to the shapes and to the surfaces of part of the elementary outlines of the previous iteration.

5. The method according to claim 1, wherein the ratio of the number of elementary outlines forming the set of elementary outlines to the number of elementary outlines forming the set of elementary outlines during the breakdown step of the previous iteration is in the range from 0.8 to 1.2.

6. The method according to claim 1, wherein after the step S4), the work pattern is modified to becomes closer to the shape of the pattern to be formed.

7. The method according to claim 1, wherein the work pattern has at least one flat edge and step S7) is configured so that the new work pattern has the same flat edge.

8. A method of writing a pattern on a substrate by electronic radiation, comprising the steps of:
   S1) providing a pattern to be formed on a substrate to a calculator;
   S2) forming a work pattern from the pattern to be formed, the work pattern comprising a single external envelope;
   S3) breaking down the work pattern into a set of elementary outlines comprising a plurality of elementary outlines each having a single external envelope, and defining a set of irradiation conditions for each elementary outline; and
   S4) comparing the pattern to be formed with a simulation pattern representing the sets of irradiation conditions for the elementary outlines to discriminate a simulation pattern representative of the pattern to be formed from a simulation pattern which is not representative of the pattern to be formed;
   wherein, if the simulation pattern is not representative of the pattern to be formed, the method comprises the steps of:
   S7) determining at least one shift vector between at least a portion of the external envelope of the pattern to be formed and a corresponding portion of the external envelope of the simulation pattern;
   S8) displacing at least a portion of the external envelope of the work pattern or of the pattern to be formed according to a displacement vector determined at least from the corresponding shift vector to form a new work pattern; and carrying out a new iteration of steps S3) and S4);

transmitting the sets of irradiation conditions of the last iteration to an electron gun control circuit before writing the pattern on the substrate using at least a final iteration of the work pattern, the method further comprising: S9) writing the pattern using at least the final iteration of the work pattern.

9. The method according to claim 8, wherein during the step S3), the first set of elementary outlines is configured to avoid an overlapping between two adjacent elementary outlines.

10. The method according to claim 8, wherein the step S3) comprises breaking down the work pattern into a set of elementary patterns, each elementary pattern defining a respective elementary outline.

11. The method according to claim 10, wherein the elementary patterns have a non-zero surface that fills the working pattern.

12. A method of writing a pattern by electronic radiation, comprising successively:

S1) providing a pattern to be formed on a substrate to a calculator;

S2) forming a work pattern from the pattern to be formed, the work pattern comprising a single external envelope;

S3) breaking down the work pattern into a set of elementary outlines comprising a plurality of elementary outlines each having a single external envelope, and defining a set of irradiation conditions for each elementary outline;

S3') computing a simulation pattern by means of the sets of irradiation conditions for the elementary outlines representing the work pattern, the simulation pattern taking into account diffusion of electron outside of each elementary outline;

S4) comparing an external envelope of the pattern to be formed with an external envelope of the simulation pattern to discriminate a simulation pattern representative of the pattern to be formed from a simulation pattern which is not representative of the pattern to be formed;

wherein, if the simulation pattern is not representative of the pattern to be formed, the method comprises the steps of:

S7) determining at least one shift vector between at least a portion of the external envelope of the pattern to be formed and a corresponding portion of a simulation external envelope of the simulation pattern;

S8) displacing at least a portion of the external envelope of the working pattern according to a displacement vector determined at least from the corresponding shift vector to form a new work pattern; and carrying out at least a new iteration of steps S3), S3') and S4) before writing the pattern on the substrate using at least a final iteration of the work pattern, the method further comprising: S9) writing the pattern using at least the final iteration of the work pattern.

\* \* \* \* \*